United States Patent [19]

Santos et al.

[11] Patent Number: 5,409,803

[45] Date of Patent: Apr. 25, 1995

[54] SINGLE-PHASE DEVELOPERS FOR LITHOGRAPIC PRINTING ELEMENTS

[75] Inventors: Llandro C. Santos, Cherry Hill; Luigi Amariti, Voorhees, both of N.J.

[73] Assignee: E. I. Du Pont de Nemours and Company, Wilmington, Del.

[21] Appl. No.: 82,009

[22] Filed: Jun. 4, 1993

Related U.S. Application Data

[63] Continuation of Ser. No. 784,339, Oct. 29, 1991, abandoned.

[51] Int. Cl.⁶ .............................. G03F 7/32; G03C 5/00
[52] U.S. Cl. .................................. 430/331; 430/302; 430/309; 430/325
[58] Field of Search ............... 430/302, 309, 331, 329, 430/325; 134/38, 40; 252/547, 170, 171, 162, DIG. 8

[56] References Cited

U.S. PATENT DOCUMENTS

| | | | |
|---|---|---|---|
| 2,932,618 | 4/1960 | Oberdorfer | 252/170 |
| 4,141,733 | 2/1979 | Guild | 96/49 |
| 4,416,976 | 11/1983 | Schell | 430/331 |
| 4,464,461 | 8/1984 | Guild | 430/326 |
| 4,508,634 | 4/1985 | Elepano et al. | 134/38 |
| 4,576,899 | 3/1986 | Amariti et al. | 430/309 |
| 4,594,111 | 6/1986 | Coonan | 252/170 |
| 4,714,670 | 12/1987 | Amariti et al. | 430/331 |
| 4,729,941 | 3/1988 | Itoh et al. | 430/331 |
| 4,822,723 | 4/1989 | Dhillon | 430/331 |
| 5,035,982 | 7/1991 | Walls | 430/331 |
| 5,098,594 | 3/1992 | Doscher | 252/170 |
| 5,230,989 | 7/1993 | Urabe et al. | 430/309 |

FOREIGN PATENT DOCUMENTS

| | | | |
|---|---|---|---|
| 0097282 | 1/1984 | European Pat. Off. | 430/331 |
| 0253675 | 7/1987 | European Pat. Off. | |
| 63-136041 | 6/1988 | Japan | 430/331 |
| 3-6561 | 1/1991 | Japan | 430/331 |
| 5-34931 | 2/1993 | Japan | 430/309 |
| 8707735 | 6/1987 | WIPO | |
| WO89/11526 | 11/1989 | WIPO | |

OTHER PUBLICATIONS

PTO English translation of Japanese Patent Application 3–6561 (pub. Jan. 14, 1991).

*Primary Examiner*—Janis L. Dote

[57] ABSTRACT

A developer is disclosed for lithographic printing elements. The developer is single phase and contains an aliphatic cyclic carbonate, water, and optional ingredients.

5 Claims, No Drawings

SINGLE-PHASE DEVELOPERS FOR LITHOGRAPIC PRINTING ELEMENTS

This is a continuation of application Ser. No. 07/784,339 filed Oct. 29, 1991, now abandoned.

FIELD OF THE INVENTION

This invention relates to developers used to prepare lithographic printing plates. More particularly, the invention relates to single-phase aqueous developers particularly suited to develop subtractive diazo sensitized and photopolymer lithographic printing elements.

BACKGROUND OF THE INVENTION

Lithographic printing plates can be made from photosensitive printing elements by imagewise exposing the element, thereby effecting a change in solubility between the exposed and unexposed areas, and then removing the more soluble areas in a development step. The development step can be either an additive or a subtractive process. In an additive process, the developer removes the more soluble areas, but at the same time it deposits an oleophilic reinforcing resin on the less soluble areas which remain on the plate. In a subtractive process, the non-image areas are removed by the developer, but there is no additional reinforcing resin. Printing elements which are developed by a subtractive process (i.e., subtractive elements) are generally based on light-induced polymerization, either free-radical or cationic.

Developers for subtractive printing elements can be emulsions or single-phase systems, either all-organic or aqueous-based. Emulsion developers have a tendency to redeposit polymer removed from non-image areas onto image areas, resulting in undesired specks on the developed plate. The emulsion also has a tendency to separate on storage, limiting its useful lifetime. Some emulsion developers exhibit high viscosity levels unsuitable for many lithographic plate processing machines.

All-organic developers are generally less desirable because of unpleasant odors, toxicity, flammability and serious disposal problems.

Therefore, there is a need for a single-phase aqueous-based developer for subtractive photosensitive printing elements.

SUMMARY OF THE INVENTION

This invention provides a single-phase developer for subtractive lithographic printing elements comprising:

(a) approximately 5–50 weight percent, based on the total weight of the developer, of an aliphatic cyclic carbonate having the formula:

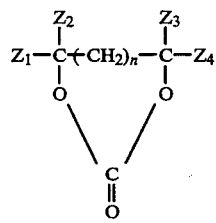

where n is an integer from 0–2 and $Z_1$, $Z_2$, $Z_3$ and $Z_4$ are independently selected from the group consisting of hydrogen, $C_1$–$C_3$ alkyl, hydroxyalkyl, chloroalkyl, chlorine, hydroxyl and phenyl, and (b) approximately 20–80 weight percent water, based on the total weight of the developer.

In preferred embodiments, the developer has one or more of the following ingredients present: (1) a hydrophilic agent effective to increase water solubility of the carbonate, (2) a quarternary ammonium compound, (3) a polymeric antiprecipitant agent, (4) a dye, and (5) other optional ingredient (s), such as surfactants, that may be used to advantage in developers.

DETAILED DESCRIPTION OF THE INVENTION

The single-phase developers of the invention comprise water and an aliphatic cyclic carbonate. It is preferred that the developers further contain a quaternary ammonium compound. The water generally constitutes 20–80% by weight, based on the total weight of the developer solution.

The aliphatic cyclic carbonates selected in practicing the invention are at least partially soluble in water to form a single-phase solution with water, i.e., the selected carbonate(s) will form a 5% by weight solution in water while still maintaining a single phase. Carbonates which can be selected are those having the formula:

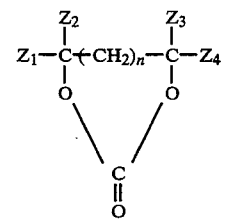

where n is an integer from 0–2 and $Z_1$, $Z_2$, $Z_3$ and $Z_4$ are independently selected from the group consisting of hydrogen, $C_1$–$C_3$ alkyl, hydroxyalkyl, chloroalkyl, chlorine, hydroxyl and phenyl. As used herein, the identified substituent groups include those that have been substituted, provided that the substitution does not render the carbonate ineffective in practicing the invention. The preferred cyclic aliphatic carbonates have the formula:

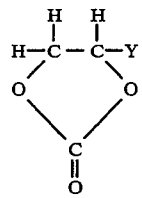

where Y is selected from hydrogen, methyl and hydroxymethyl.

Preferred aliphatic cyclic carbonates are glycerine carbonate, ethylene carbonate and propylene carbonate. Propylene carbonate does an excellent job of removing the dark reaction products that may be present in the unexposed areas of the printing element, while not removing the light exposed portions of the same plate, and is particularly preferred. The dark reaction products are less soluble byproducts formed as a result of aging or improper storage. Propylene carbonate also is preferred because of its relatively low toxicity.

Other representative useful carbonates are 5-methyl-5-propyl-1,3-dioxol-2-one; 4,4,5, 5-tetrachloro-1,3-dioxol-2-one; 5,5-diethyl-1,3-dioxol-2-one; chlorethylenecarbonate; 4,5-dichloro-1, 3-dioxol-2-one; 4,5-diphenyl-1,3-dioxol-2-one; and 1,3-dioxol-2-one.

To be effective the concentration of carbonate in the developer solution should be at least about 5% by weight, based on the total weight of the developer solution. The amount of carbonate can be increased to about 14% by weight, the amount necessary to form a saturated water solution, without forming a second phase. However, in some cases it is desirable to increase the amount of carbonate in the water solution above 14% in order to increase the solvent strength of the developer, while still maintaining a single-phase system. This can be accomplished by the addition of a third component to the developer, generally a hydrophilic agent. The interaction between the hydrophilic agent and the carbonate allows for the addition of more carbonate to the single-phase solution. Propylene glycol is a preferred hydrophilic agent. Representative other useful hydrophilic agents are ethylene glycol and ethylene carbonate. Mixtures of hydrophilic agents also may be used. When used, such hydrophilic agents are generally present in an amount from about 1% to 20% by weight, based on the total weight of the developer. When one or more hydrophilic agents are present in the developer, the concentration of carbonate in the developer can be up to about 50% by weight, based on the total weight of the developer solution, provided that the solution remains a single phase.

It is preferred that a quaternary ammonium compound also be present in the developer solution. A particularly preferred type of quaternary ammonium compound is one having the formula:

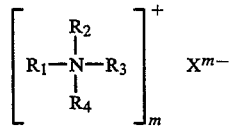

where m is an integer from 1 to 3; $R_1$ is a hydroxyalkyl radical, preferably containing 2 to 8 carbon atoms, and $R_2$, $R_3$ and $R_4$ are the same or different and are selected from the group consisting of alkyl or aryl radicals, preferably containing 1 to 10 carbon atoms, and hydroxyalkyl radicals, preferably containing 2 to 8 carbon atoms; and $X^{m-}$ is a nonreactive counteranion.

Examples of ammonium moieties that may be selected to advantage include trimethylethanolammonium, dimethyldiethanolammonium, methyltriethanolammonium and tetraethanolammonium moieties. Also useful, when used in conjunction with aliphatic cyclic carbonates, are quaternary ammonium polymers, such as ureylene quaternary ammonium polymers (available from Miranol Chemical Co. under the trade name of Mirapol®) and poly(1,1-dimethyl-3,5-dimethylpiperidinium). Suitable nonreactive counteranions include chloride, bromide, acetate, nitrate, tetrafluoroborate, hexafluorophosphate, sulfate, sulfonate, phosphate and the like. The hydroxide generally should not be used because the high pH may present corrosion problems. Trimethylethanolammonium chloride is most preferred.

The quaternary ammonium compound, if used, typically is present in an amount from about 0.1% to 60%, by weight, based on the total weight of the developer solution.

The single-phase developers also may contain a polymeric antiprecipitant agent. The antiprecipitant acts to emulsify the portion of the photosensitive coating removed from the non-image areas, and thus prevents this material from redepositing. Examples of suitable anti precipitant agents include copolymers of ethylene and propylene oxides; polyvinyl alcohol and polyvinyl acetate; vinyl maleic anhydride copolymers; polyethylene glycols; cyclodextrins; and mixtures thereof. A preferred antiprecipitant is a block copolymer of ethylene oxide and propylene oxide.

The antiprecipitant can be present in an amount from 0.1 to about 10 weight percent, based on the total weight of the developer; preferably from about 1.0 to 5.0 weight percent.

The developers of the invention also may contain one or more hydrophilic surfactant. The surfactant may be either nonionic, cationic, anionic, or amphoteric, with nonionic surfactants generally being preferred. Any one of a number of known surfactants can be incorporated, such as those including ethylene oxide groups as their hydrophilic constituent. Polymeric quaternary ammonium surfactants can also be used to advantage.

Excessive surfactant concentrations render the developer solution too foamy, may result in some image loss, and/or may reduce developer activity. Total surfactant concentration, based on the total weight of the developer solution, can range from 0 to about 10 weight percent, from typically about 0.1 to about 2 weight percent.

The single-phase developers also may contain other materials known in the art to be useful in such compositions. For example, it is preferred to include citric acid, which is known to aid in providing clear backgrounds. When present, citric acid generally constitutes about 0.05 to 10% by weight, based on the total weight of the developer solution. Basic compounds, preferably amines, may be added to adjust the pH, with dihydroxyethylethylenediamine and N-methylglucamine being preferred because of their low toxicity. Miscellaneous materials can be added, provided that they do not significantly alter the overall properties of the composition. For example, defoamers or antifoamers, synthetic resin viscosity increasing agents, colorants, corrosion inhibitors, chelating agents, humectants, antioxidants, and buffers, may be included for conventional purposes.

In some cases a dye may be added to the developer. This is particularly advantageous when developing lithographic printing elements which are themselves not colored. Colorless printing elements are frequently made to avoid the problem of plate rejections based on purely cosmetic defects in coloration. Since it is necessary to have color in the final plate in order to inspect image vs. non-image areas, color is added in an additive development step. However, it is possible to add color to the image areas in a subtractive development step by using the developer of the invention which contains a dye. The level of the dye present must be kept low enough to avoid staining of the background, non-image areas, while still providing visible color to the image areas. In general, the dye, when present, will have a concentration from about 0.003% to 0.075% by weight, based on the total weight of the solution. Both cationic and anionic dyes can be used. It is preferred to use cationic dyes because of lower background staining.

Typical dyes which can be used include Basonyl Red and Flexo Blue 650, made by BASF.

To prepare the developers of the invention, the desired amount of aliphatic cyclic carbonate is dissolved in water, preferably with the assistance of hydrophilic agents to extend the solubility. Small amounts of surfactant can then be added as well as the other optional ingredients.

In general, the developers of this invention will develop subtractive lithographic printing elements, i.e., photosensitive elements in which the non-image areas are removed without the addition of a reinforcing resin to the image areas. The subtractive lithographic printing elements generally comprise a support, typically anodized aluminum, and a photosensitive layer which is susceptible to a photoinsolubilization process. Suitable photosensitive materials include diazo-sensitized compositions containing monomers or oligomers susceptible to cationic polymerization, such as epoxy or phenolic resins. The developers are particularly well suited to the development of MagnaRun and MagnaNews lithographic printing elements (Imperial Metal & Chemical Co., Philadelphia, Pa.). The developers which additionally contain dye are particularly well suited for the development of S-300 lithographic printing elements (Imperial Metal & Chemical Co., Philadelphia, Pa.). The developers of the invention also can be used with photopolymer printing elements, i.e., those in which the photosensitive layer undergoes free-radical polymerization when exposed to light. Examples of such printing elements include Du Pont Howson plates AQ-1 and AQ-2, Enco plate A30 and Polychrome plate X70.

To prepare a printing plate from the subtractive lithographic printing element, the element is first exposed to actinic radiation in an imagewise manner. The areas of the element which are exposed to actinic radiation are insolubilized, i.e., become less soluble. The developer solution of the invention is then applied to the exposed element to effect removal of those areas of the photosensitive layer which were not exposed to actinic radiation and hence have not been insolubilized. The developer solution can be applied in any conventional manner including immersion, spraying, and brush or roller application. The developer is frequently applied using equipment specifically designed for the development of lithographic printing elements.

EXAMPLES

All proportions herein are by weight, based on the total weight of the developer solution, unless otherwise noted.

Example 1

A developer solution was prepared by combining water, propylene carbonate and propylene glycol in the amounts given below, and then adding the remaining ingredients.

| Ingredient | Weight % |
| --- | --- |
| Water | 49.82 |
| Propylene carbonate | 16.19 |
| Propylene glycol | 4.76 |
| Choline chloride[a] | 23.81 |
| Polyvinyl alcohol | 3.81 |
| Citric acid | 0.20 |
| N-Methylglucamine | 0.26 |
| Mirapol ® WT[b] | 0.95 |
| Surfinol ® 465[c] | 0.20 |

[a] trimethylethanolammonium chloride
[b] polymeric ureylene quaternary ammonium surfactant made by Miranol Chemical Co.
[c] nonionic surfactant made by Air Products

Example 2

The developer from Example 1 was used to develop MagnaRun lithographic plates (Imperial Metal & Chemical Co., Philadelphia, Pa.).

The plates were imagewise exposed at an intensity of 128 mJ/cm$^2$. A Du Pont Processor, Autolith, was charged with the developer from Example 1 in the developer compartment, and with Ecosystem Finisher (Imperial Metal & Chemical Co., Philadelphia, Pa.) in the finisher section. The exposed plates were passed through the processor at a plate throughput speed of 4.5 feet per minute.

The plates developed had acceptable lithographic properties. No piling, plugging or redeposit was observed in these developed plates.

Example 3

A second developer solution was prepared using an ethylene oxide/propylene oxide block copolymer as an antiprecipitant. The solution was prepared by combining water, propylene carbonate and propylene glycol in the amounts given below, and then adding the remaining ingredients.

| Ingredient | Weight % |
| --- | --- |
| Water | 47.3 |
| Propylene carbonate | 16.0 |
| Propylene glycol | 4.5 |
| Choline chloride | 20.5 |
| Pluronic ® F68[a] | 4.5 |
| Polyethylene glycol 400[b] | 4.5 |
| Citric acid | 0.2 |
| N-Methylglucamine | 0.3 |
| Mirapol ® WT | 2.0 |
| Surfinol ® 465 | 0.2 |

[a] block copolymer of ethylene oxide and propylene oxide (BASF)
[b] Union Carbide Corp.

Example 4

MagnaRun presensitized plates were exposed and developed as described in Example 2 using the developer from Example 3.

Similar results were obtained.

Example 5

A developer was prepared as described in Example 1 with the addition of 0.015% by weight of the cationic dye Basonyl Red (BASF, Germany).

Colorless presensitized printing plates, S-300 (Imperial Metal & Chemical Co., Philadelphia, Pa.), were exposed as described in Example 2. The exposed plates were developed according to the procedure described in Example 2 using the colored developer described above. Results similar to those in Example 2 were obtained.

Example 6

A developer was prepared as described in Example 3 with the addition of 0.015% by weight of the cationic dye Basonyl Red (BASF, Germany).

Colorless presensitized printing plates, S-300 (Imperial Metal & Chemical Co., Philadelphia, Pa.), were exposed as described in Example 2. The exposed plates were developed according to the procedure described in Example 2 using the colored developer described above. Results similar to those in Example 2 were obtained.

Having described the invention, the following and equivalents thereof are claimed.

What is claimed is:

1. A single-phase developer for subtractive lithographic printing elements, comprising;
   (a) approximately 5 to 50 percent of an aliphatic cyclic carbonate having the formula

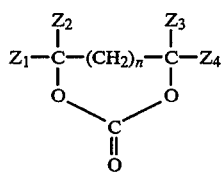

where n is an integer from 0-2 and $Z_1$, $Z_2$, $Z_3$ and $Z_4$ are independently selected from the group consisting of hydrogen, C1-C3 alkyl, hydroxyalkyl, chloroalkyl, chlorine, hydroxyl and phenyl;
   (b) about 1 to 20 percent of a hydrophilic agent selected from the group consisting of propylene glycol, ethylene glycol and mixtures thereof;
   (c) about 0.1 to 60 percent of a quaternary ammonium compound having the formula

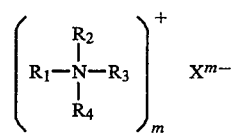

where m is an integer from 1 to 3: $R_1$ is a hydroxyalkyl radical, $R_2$, $R_3$ and $R_4$ are the same or different and are selected from the group consisting of alkyl radicals, aryl radicals, and hydroxyalkyl radicals; the quaternary ammonium compound has an ammonium moiety selected from the group consisting of trimethylethanolammonium, dimethyldiethanolammonium, methyltriethanolammonium, and tetraethanolammonium; and $X^{m-}$ is a nonreactive counteranion; and
   (d) approximately 20 to 80 percent water, wherein said percents are weight percents based on the total weight of the developer.

2. The developer of claim 1 wherein the carbonate is selected from the group consisting of glycerine carbonate, ethylene carbonate, and propylene carbonate.

3. The developer of claim 2 further containing a polymeric antiprecipitant agent.

4. The developer of claim 2 further containing 0.1 to about 10 per percent by weight of an antiprecipitant selected from the group consisting of copolymers of ethylene oxide and propylene oxide; polyvinyl alcohol; polyvinyl acetate; vinyl maleic anhydride copolymers; polyethylene glycols; cyclodextrins and mixtures thereof.

5. The developer of claim 2 further containing an effective amount of dye to provide visible color to image areas of the printing element.

* * * * *